United States Patent [19]

Mettoudi

[11] Patent Number: 4,636,758

[45] Date of Patent: Jan. 13, 1987

[54] FREQUENCY MULTIPLIER FOR MILLIMETER WAVES HAVING MEANS FOR ADJUSTING HARMONIC FREQUENCY

[75] Inventor: Isaac Mettoudi, Levallois Perret, France

[73] Assignee: Alcatel Thomson Faisceaux Herziens, Levallois Perret, France

[21] Appl. No.: 692,051

[22] Filed: Jan. 16, 1985

[30] Foreign Application Priority Data

Jan. 27, 1984 [FR] France .................. 84 01288

[51] Int. Cl.⁴ .......................................... H03B 19/00
[52] U.S. Cl. ..................................... 333/218; 333/250
[58] Field of Search ................ 333/218, 250; 331/96, 331/107 DP, 107 C; 363/157, 158, 159; 329/160–162

[56] References Cited

U.S. PATENT DOCUMENTS

| 3,334,295 | 8/1967 | Polin et al. ........................... 333/218 |
| 3,366,805 | 1/1968 | Bear et al. ......................... 333/250 X |
| 3,448,415 | 6/1969 | DeLoach, Jr. ....................... 333/250 |
| 3,718,866 | 2/1973 | Edrich ............................ 333/250 X |
| 3,878,480 | 4/1975 | Hulderman et al. .................. 331/96 |
| 3,882,419 | 5/1975 | Swartz et al. ........................ 331/96 |
| 3,939,946 | 2/1976 | Kozul et al. ......................... 333/250 |
| 4,063,186 | 12/1977 | Rubin ............................. 333/250 X |

FOREIGN PATENT DOCUMENTS

| 908746 | 7/1949 | Fed. Rep. of Germany . |
| 45-29251 | 9/1970 | Japan ................................. 363/157 |

Primary Examiner—Eugene R. LaRoche
Assistant Examiner—Benny Lee
Attorney, Agent, or Firm—Roland Plottel

[57] ABSTRACT

A frequency multiplier according to the invention comprises a coaxial input, an elastic device constituted by two parts sliding within one another, the outer part having a flexible metal bellows and which is extended by a spring, an impedance matching low pass filter requiring no setting, an IMPATT VARISELF diode, a coaxial line, a waveguide transition regulating plunger, a waveguide, a diode holder whose position is regulatable in translation by a button, a cavity tuned to a harmonic frequency, a mobile short-circuit closing the cavity and which is regulatable in translation by means of a knurled wheel in order to adjust the resonant frequency of the cavity to a harmonic frequency and a pin screw immobilizing in rotation the diode holder and the mobile short-circuit.

4 Claims, 6 Drawing Figures

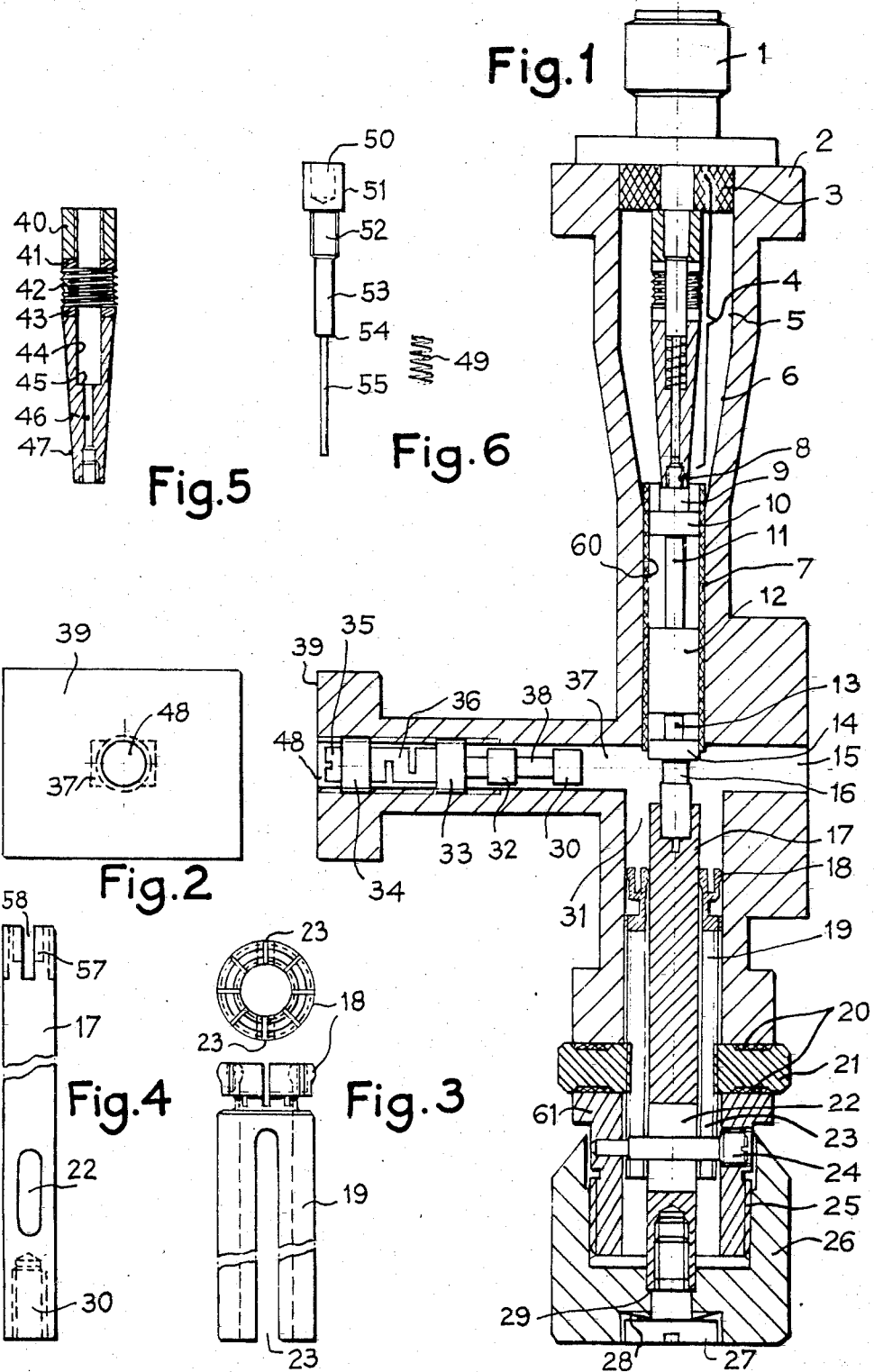

FREQUENCY MULTIPLIER FOR MILLIMETER WAVES HAVING MEANS FOR ADJUSTING HARMONIC FREQUENCY

BACKGROUND OF THE INVENTION

The present invention relates to a frequency multiplier of the type used for telecommunications by millimeter waves for obtaining a very high stability, ultra-high frequency signal source.

The realisation of millimeter wave radio links requires phase-locked ultra-high frequency sources able to supply a few dozen milliwatts, which are capable of being frequency modulated and which are able to function correctly in the temperature range −30° to +70° C. It is known to realise such sources at frequencies of approximately 4 GHz, but not with frequencies of approximately 40 GHz by means of an oscillator operating correctly at said frequency. Thus, one known procedure is e.g. of combining a frequency multiplier which multiplies the frequency by 10 with a phase-locked 4 GHz signal source in order to obtain a phase-locked 40 GHz signal. This process makes it possible to obtain a much better frequency stability than that of e.g. a Gunn diode oscillator, operating directly at the frequency of 40 GHz.

It is known to realise a multiplier capable of multiplying a frequency by 10, which receives an incident signal of frequency 4 GHz and supplying an output signal of frequency 40 GHz by means of an avalance semiconductor diode for frequency multiplaction, by applying the incident signal to the diode via an impedance matching low pass filter thus preventing the rise of harmonic frequencies towards the source of the incident signal and by collecting the tenth harmonic generated by the diode by means of a fixed tuned cavity containing the diode, the latter having a regulatable position within the cavity in order to obtain the operation giving the best efficiency. The impedance matching low pass filter generally comprises a transformer, whose very difficult control must be adjusted for each multiplier. The efficiency obtained with the known devices incorporating an avalance diode is approximately 5%, whereas in the case of a step-receovery diode it is 1% or 2%. The object of the invention is to obviate this low efficiency, while reducing to the minimum the number of controls to be carried out on the multiplier.

SUMMARY OF THE INVENTION

The present invention therefore relates to a frequency multiplier for millimeter waves comprising a coaxial input for receiving an incident signal, whose frequency is to be multiplied, a square waveguide whereof a first end constitutes one output of the multiplier, a semiconductor diode placed in the waveguide, a diode holder to which is fixed a first terminal of the diode, the diode holder being stationary in rotation and mobile in translation along an axis parallel to the small side of the waveguide and located in the plane of symmetry thereof, a cavity located in one wall of the guide, at the location of the diode, said cavity being tuned to the desired harmonic frequency, a cavity regulating plunger having a circular cross-section centered on the diode holder, which slides along the diode holder and is stationary in rotation, at least one short-circuiting plunger which partly encloses a second end of the guide, an impedance matching low pass filter mobile in translation along the same axis as the diode holder and having an output in contact with a second terminal of the diode, having a pass band at least equal to the frequency of the incident signal and having an input coupled to the coaxial input, as well as an elastic device connecting said coaxial input to an input of the filter, no matter what the diode position.

BRIEF DESCRIPTION OF THE DRAWINGS

The invention is described in greater detail hereinafter relative to a non-limitative embodiment and the attached drawings, wherein show:

FIG. 1 a sectional view of an embodiment of the multiplier according to the invention.

FIGS. 2 to 6 views of various parts of said embodiment.

DESCRIPTION OF A PREFERRED EMBODIMENT

FIG. 1 shows an embodiment in which the incident signal, whose frequency is 4 GHz, is applied to the multiplier by a coaxial input constituted by a coaxial connector 1 having a base fixed to the multiplier body 2 by four (not shown) screws. Beneath said base, body 2 has a cylindrical hole 5 extended by a cone 6 up to a cylindrical hole 7, which has a smaller diameter than that of hole 5. Holes 5, 6 and 7 have the same axis of symmetrical revolution. The conductor of the core of coaxial connector 1 projects beyond the base of said connector and is welded into a hole which is not shown in FIG. 1 and which is made in a first end of an elastic device 4. This first end is centered in hole 5 by a Teflon part 3. A second end of elastic device 4 has a tapped hole, in which is screwed a threaded rod or bolt 8 constituting the input of an impedance matching low pass filter formed by a metal part 8 to 14 and a Teflon tube 60, which surrounds it with a tight fit. The elastic device 4 electrically connects the core of coaxial connector 1 to said filter, whilst having a uniform impedance of 50 Ohms and whilst permanently exerting a pressure on said filter, which is free to move longitudinally in hole 7.

The metal part of the filter is constituted by a series of cylinders cut from the same piece of metal and having three separate diameter values. Whilst starting from the first end, said metal part has the aforementioned threaded rod 8, a first cylinder 9, whose diameter is the same as that of the second end of the elastic device 4, a second cylinder 10, whose diameter is equal to the internal diameter of tube 60, a third cylinder 11, whose diameter is much smaller than the internal diameter of tube 60, a fourth cylinder 12, whose diameter is equal to the internal diameter of tube 60, a fifth cylinder 13, whose diameter is much smaller than the internal diameter of tube 60 and a sixth cylinder 14, whose diameter is equal to the internal diameter of tube 60 and which constitutes the second end and the output of the filter.

The external diameter of tube 60 is slightly smaller than the diameter of hole 7, so as to enable the complete filter to slide within hole 7. The function of the conical hole 6 is to provide a progressive transition between the diameter of hole 5 corresponding to the dimensions of the coaxial connector 1 and the diameter of hole 7 corresponding to the diameter of the filter, which is slightly smaller than the large side of the guide.

The force exerted by the elastic device 4 moves the filter in such a way that its end 14 bears on a first terminal of a diode 16 located in the axis of symmetry of the filter and of the elastic device 4. A second terminal of the diode 16 is secured to the end of a diode holder 17, which has a cylindrical shape, a circular cross-section and whose axis of symmetry is in the extension of the axis of symmetry of device 4 and of the filter. Diode 16 is positioned within a waveguide, whose axis is perpendicular to the axis of symmetry of the device, the filter and the diode holder 17. This waveguide comprises first and second portions 37, 15, located on either side of diode 16 and the latter is located in the median plane of the wave-guide.

The first part 37 of the waveguide is partially closed by a metal part having a first cylinder 30, whose diameter is smaller than the width of the waveguide, a second cylinder 38, whose diameter is smaller than the diameter of cylinder 30, a third cylinder 32 identical to cylinder 30 and connected thereto by the second cylinder 38. Cylinder 32 is integral with a self-locking screw constituted by a screw head 35, a first threaded cylinder 34 and a second threaded cylinder 33, connected by a cylindrical rod 36. Cylinders 34, 33, 32, 38, 30 and rod 36 have a common axis of symmetry.

Rod 36 has two partial breaks perpendicular to the axis of symmetry and which give said rod 36 a certain longitudinal elasticity. During installation, rod 36 is compressed so that it exerts a force tending to move the threaded cylinders 33, 34 apart, in order to immobilize them in a tapped hole 48. The latter is formed in the extension of guide portion 37 and has a circular cross-section and a diameter equal to the width of the guide, in order to permit the introduction of cylinders 30 and 32. This tapped hole 48 issues onto a planar surface 39 perpendicular to the axis of symmetry common to the tapped hole 48 and to the waveguide 37, 15.

FIG. 2 is a view of the planar face 39 with the tapped hole 48 and the first portion 37 of the waveguide represented in dotted line form. The screw head 35 does not extend outside the tapped hole 48, so that a heat dissipator can be fixed to the planar face 36. The threaded cylinders 33, 34 and the rod 36 constitute a device for regulating the position of cylinders 30, 32 having no clearance and not requiring a lock nut for fixing the same, which greatly simplifies the adjustment or control. The cylinders 30 and 32 constitute mobile short-circuits, from the standpoint of the ultra-high frequency waves. The adjustment of their position permits an optimum regulation of the transition between waveguide 37 and the coaxial line supplying diode 16, constituted by elastic device 4 and the filter 8 to 14 and 60.

This impedance matching low pass filter has the functions of on the one hand preventing the rise of harmonic signals towards the 4 GHz source and on the other hand of matching the impedance of the coaxial line from the source to the impedance of diode 16. In this example, the filter effects a 50 Ohm-8 Ohm matching and there is a pass band slightly above 4 GHz. This type of filter is known and its construction falls within the routine activity of the Expert. It has the advantage of being mass producible, there being no need for a setting on each individual filter.

Around the diode holder 17 is provided a cylindrical cavity 31 having a circular cross-section and a slightly larger diameter than the large side of guide 15-37, hollowed out of body 2 and having for its axis of symmetry the axis of symmetry of the diode support 17 and which is closed by a mobile short-circuit 18, integral with a metal cylinder 19 sliding along the diode holder 17. Diode holder 17 and cylinder 19 are immobilized in rotation by a pin screw 24, which passes through and fixes them. Cylinder 19 has a thread, which is screwed into the thread of a knurled wheel 21, making it possible to regulate the position of short-circuit 18.

Wheel 21 rotates freely about the axis of symmetry of diode holder 17 and cylinder 18, but is immobilized in translation. On its two sides, it carries Teflon packings 20 ensuring a gentle friction on the two bearing surfaces, whereof one is machined on body 2 and the other in a part 61 constituting a cage containing wheel 21 and which is fixed to body 2 by four not shown screws. The pin screw 24 has a threaded head, which is screwed into a threaded hole of part 61.

FIG. 3 shows two more detailed views of the short-circuit 18 and of cylinder 19. The short-circuit 18 comprises two rings or crowns formed from flexible segments. An outer ring ensures the contact with the wall constituted by the multiplier body 2 and an inner ring ensures the contact with the wall constituted by diode holder 17. The entire surface of cylinder 19 is threaded, but it has two diametrically opposite holes 23, which are elongated along a generatrix and whose width is exactly equal to the diameter of the pin screw 24. The length of holes 23 greatly exceeds this diameter, so that it permits a translation of cylinder 19 along its axis. However, as its width is equal to the diameter of the pin screw 24, cylinder 19 is immobilized in rotation. By acting on knurled wheel 21, an operator can displace short-circuit 18 to adjust the resonance of cavity 31 to a given harmonic frequency, e.g. to the frequency 40 GHz. The absence of rotation of short-circuit 18 permits stable and repeatable settings and adjustments.

In FIG. 1, diode holder 17 is integral in translation, but not in rotation with a knurled button 26, fixed to the opposite end to that at which diode 16 is fixed. At this end, diode holder 17 has a tapped hole located on its axis of symmetry and in which is screwed a screw 27. Button 26 is secured against diode holder 17 by an elastic washer 28 placed between it and screw 27. The elastic washer 28 makes it possible to keep button 26 freely rotating about the screw 27, whilst moving diode holder 17 in translation when button 26 is displaced. Screw 27 has a shoulder 29 on its shank, so that it can be rendered integral with the diode holder 17 by fixing it in the tapped hole of diode holder 17. Button 26 is srewed into a thread 25 on a cylindrical portion of part 61 and whose axis of symmetry is the axis of diode holder 17.

FIG. 4 is a more detailed view of diode holder 17. Its first end has a cylindrical hole 57, provided with four slots 58 which are deeper than hole 57 and which constitute a clamp for securing the second terminal of diode 16. The other end is provided with a tapped hole 30 for receiving the threaded portion of the shank of screw 27. An oblong hole 22 passes through diode holder 17 perpendicular to its axis of symmetry. Its width is precisely equal to the diameter of the pin screw 24, so as to prevent any rotation of diode holder 17 and its length, corresponding to a generatrix, greatly exceeds the diameter of screw 24, whilst permitting a certain regulating travel for the position of diode 16 in the waveguide.

FIGS. 5 and 6 show parts constituting the elastic device 4. It comprises two main parts and a spring 49 having a common axis of symmetrical revolution. FIG. 5 shows a section through a first part forming the exterior of device 4. FIG. 6 shows a non-sectional view of a second part forming the interior of device 4.

In FIG. 5, the first part is constituted by a first spacer 40, an intermediate part 41, a bellows 42, an intermediate part 43 and a second spacer 47, which are soldered to one another in this order by tin solder. Spacer 40 has a tapped hole drilled along its axis of symmetry. The second spacer 47 has two holes 44, 46 of different diameters and drilled along its axis of symmetry. The largest hole 44 is drilled from the side where the spacer 47 is soldered to the intermediate part 43 and its diameter corresponds to the diameter of spring 49, which is a spiral spring placed in hole 44. The smallest diameter hole 46 is drilled from the other end of spacer 47. It has a thread over a portion of its length making it possible to fix the threaded rod 9 of the impedance matching low pass filter. This hole 46 issues into hole 44, whilst forming a shoulder 45, against which bears spring 49.

Bellows 42 is made from a very flexible metal alloy and is commercially available with intermediate parts 41, 43 constituting its ends but being sold under the reference TOMBAC SK6307 by SERVO METER (U.S.A). Following the tin soldering of spacer 40 to the intermediate part 41 and spacer 47 to intermediate part 43, the assembly is covered with a gold coating, as is the assembly of the metal parts of the multiplier, with the exception of spring 48.

In FIG. 6, the second part of the elastic device 4 is constituted by four cylinders having different diameters and cut into the same piece of metal. A first cylinder 51 has a non-threaded blind hole 50 its axis of symmetry and whose width slightly exceeds the diameter of the conductor of the core of the coaxial connector 1. This conductor is soldered into this hole by a tin solder. The external diameter of cylinder 51 is equal to the diameter of the hole of the Teflon centering part 3.

A second threaded cylinder 52 has a diameter corresponding to that of the tapped hole of spacer 40, because the first part of device 4 is screwed onto cylinder 52. The length of cylinder 52 is equal to that of spacer 40. A third cylinder 53 has a smooth surface and a diameter equal to that of the holes passing through intermediate parts 41, 43 and has a length exceeding the maximum length of bellows 42. The intermediate parts 41, 43 can slide on said cylinder 53 with gentle friction, so that there can be a variation in the length of bellows 42, whilst still being kept completely symmetrical about its axis of symmetry of revolution.

A fourth cylinder 55 has a diameter equal to that of the hole 44 in spacer 46 in order to slide with gentle friction in said hole 44. This cylinder 55 helps to maintain the straightness of the complete first part of elastic device 4. Cylinder 55 passes through the spiral screw 49, which bears against the shoulder 54 formed by cylinder 53. As spring 49 bears on shoulder 54 and on shoulder 45, it tends to move ends 51 and 47 away from elastic device 4.

Elastic device 4 is kept perfectly straight no matter what its length, i.e. no matter what the setting of the position of diode 16, in order to prevent variations of the transmission impedance along said device, so that efficiency losses of the multiplier are prevented.

Diode 16 requires a (not shown) polarization device, which is of a conventional nature and can be realised without involving inventive activity. In the case of an avalance diode, a direct current generator supplies diode 16 by means of a polarization T connected between connector 1 and the 4 GHz incident signal source. The polarization T comprises a low pass filter making it possible to inject a tapped direct current onto the multiplier input.

The invention is not limited to the embodiment described and shown and falls within the scope of a person skilled in the art to use a different type of diode, particularly a step recovery diode, or to use a short-circuit with contacts, in place of cylinders 30, 32 partly closing waveguide portion 37.

The multiplier according to the invention has an efficiency of 10% for a multiplication by 10 at 40 GHz with an avalanche diode and 5% with a step-recovery SNAP diode, which is well above that of the prior art multipliers. Its efficiency is in particular better because the setting of cavity 31 permits an optimum tuning thereof. Its impedance matching low pass filter requires no setting, so that the adjustments and settings are simpler than in the prior art devices. For example, it is possible to cover a frequency band of 30 to 45 GHz by using an incident signal of frequency 3.6 to 4.2 GHz, which is phase-locked and by using multiplication sequences 7, 8, 9, 10 and 11 selected by regulating cavity 31. Naturally, it falls within the scope of a person skilled in the art to cover a different frequency range.

The multiplier according to the invention can be more particularly used as a millimeter wave source for radio link transmitters.

What is claimed is:
1. A frequency multiplier for millimeter waves comprising:
   a coaxial input, having a central conductor connection an an outer conductor connection, for receiving an incident signal, the frequency of which is to be multiplied;
   a low-pass filter of the impedance transformer type for filtering and impedance matching, having a filter input and a filter output, said filter input being coupled to said coaxial input and having a passband exceeding said frequency to be multiplied and less than a predetermined maximum value of multiplied frequency;
   a rectangular waveguide having a pair of greater sides and a pair of lesser sides and having a first end constituting an output of said multiplier and a second end at least partially closed by a short-circuiting piston;
   a cylindrical cavity located in a first one of said greater sides of said wave guide, having a cylindrical wall and having an axis perpendicular to said greater wave guide sides, said axis lying in a median plane of said wave guide parallel to said lesser sides thereof;
   a semiconductor diode located on said axis;
   an elongate diode carrier for said diode coaxially disposed within said cavity and to which one terminal of said diode is connected, said diode having a second terminal connected with said filter output connection of said impedance transforming low-pass filter, said filter output connecting being seated in an orifice centered on said axis and provided in a second one of said greater wave guide sides;
   means for setting said diode carrier in an adjustable position on said axis, said setting means including a rotary control for adjusting said position along said axis;
   means for preventing said diode carrier from rotating about said axis during operation of said rotary position control an annular piston coaxially located between said diode carrier and the cylindrical wall of said cavity and slidably mounted for displacement in axial direction for tuning said cavity at a desired multiple of said incident signal frequency, said diode carrier having a cylindrical outer surface over a length of said carrier leading away from said diode for accommodating a sliding movement of said annular piston, said annular piston being provided with means for preventing rotation of said piston about said axis and means for adjusting the position of said piston in the axial direction, and having at its extremity nearer to said wave guide, inner and outer flexible crowns split in radial planes by slots to assure circumferential distribution of sliding contact pressure, said inner flexible crown providing for axially sliding contact with said diode carrier and said outer crown providing for axially sliding contact with said cavity wall and a lengthwise-elastic connecting device for connecting said center conductor connection of said coaxial input to said filter input regardless of any axial adjustment of the position of said diode while maintaining substantially constant impedance for microwave transmission along its length, said connecting device incorporating a bellows for length variation, being at least partly hollow and having therewithin a helical spring urging length extension of said device.

2. Frequency multiplier according to claim 1, wherein said means for adjusting the position of said diode carrier axially comprise a knurled knob centered on said axis and mounted on screw threads for propelling said diode carrier along said axis by rotation of said knob, said knob being connected to said diode carrier at the end of said diode carrier remote from said diode for imparting axial motion to said diode carrier without requiring said diode carrier to rotate about said axis and wherein said means for preventing rotation of said diode carrier comprise an axially elongated slot traversing said diode carrier and a rotation-restraining pin passing through and fitting into said slot and mounted across said cylindrical cavity.

3. A frequency multiplier for millimeter waves comprising:

a coaxial input, having a central conductor connection and an outer conductor connection, for receiving an incident signal, the frequency of which is to be multiplied;

a low-pass filter of the impedance transformer type for filtering and impedance matching, having a filter input and a filter output, said filter input being coupled to said coaxial input and having a passband exceeding said frequency to be multiplied and less than a predetermined maximum value of multiplied frequency;

a rectangular waveguide having a pair of greater sides and a pair of lesser sides and having a first end constituting an output of said multiplier and a second end at least partially closed by a short-circuiting piston;

a cylindrical cavity located in a first one of said greater sides of said wave guide, having a cylindrical wall and having an axis perpendicular to said greater wave guide sides, said axis lying in a median plane of said wave guide parallel to said lesser sides thereof;

a semiconductor diode located on said axis;

an elongate diode carrier for said diode coaxially disposed within said cavity and to which one terminal of said diode is connected, said diode having a second terminal connected with said output connection of said impedance transforming low-pass filter, said output connection being seated in an orifice centered on said axis and provided in a second one of said greater wave guide sides;

means for adjusting and setting the position of said diode carrier axially, comprising a knurled knob centered on said axis and mounted on screw threads for propelling said diode carrier along said axis by rotation of said knob, said knob being connected to said diode carrier at the end of said diode carrier remote from said diode for imparting axial motion to said diode carrier without requiring said diode carrier to rotate about said axis;

means for preventing rotation of said diode carrier comprising an axially elongated slot traversing said diode carrier and a rotation-restraining pin passing through and fitting into said slot and mounted across said cylindrical cavity;

an annular piston slidably mounted for axial displacement in said cavity between said diode carrier and the cylindrical wall of said cavity for tuning said cavity at a desired multiple of said incident signal frequency, said diode carrier having a cylindrical outer surface over a length of said carrier leading away from said diode for accommodating a sliding movement of said annular piston, said annular piston being provided with means for preventing rotation of said piston about said axis;

means for axially adjusting the position of said annular piston comprising a hollow cylinder of circular cross-section located coaxially between said diode carrier and said wall of said cavity, connected at one end to said annular piston and extending therefrom in the axial direction away from said diode, said hollow cylinder having external screw threading for propelling said cylinder axially in response to rotary motion, and an internally threaded ring engaging said external threads of said hollow cylinder and held rotatably in said wall of said cylindrical cavity in a manner permitting the rotation of, while preventing axial displacement of, said ring and means for at least manually rotating said internally threaded ring from the outside of said cylindrical cavity wall, said means for preventing rotation of said piston comprising longitudinal slots in said hollow cylinder diametrically opposite each other for passage of said rotation-restraining pin and for thereby preventing rotation of said hollow cylinder about said axis while permitting axial displacement of said hollow cylinder, said means for axially adjusting the position of said piston having at its extremity nearer to said wave guide, inner and outer flexible crowns, said inner flexible crown providing for sliding contact with said diode carrier and said outer crown providing for sliding contact with said cavity wall; and a lengthwise-elastic connecting device for connecting said center conductor connection of said coaxial input to said filter input regardless of any axial adjustment of the position of said diode.

4. A frequency multiplier for millimeter waves comprising:

a coaxial input, having a central conductor connection and an outer conductor connection, for receiving an incident signal, the frequency of which is to be multiplied, said outer conductor coaxial input connection being connected by a tubular member with an outer sleeve forming part of said filter;

a low-pass filter of the impedance transformer type for filtering and impedance matching, having a filter input and a filter output, said filter input being coupled to said coaxial input and having a pass-band exceeding said frequency to be multiplied and less than a predetermined maximum value of multiplied frequency;

a rectangular waveguide having a pair of greater sides and a pair of lesser sides and having a first end constituting an output of said multiplier and a second end at least partially closed by a short-circuiting piston, a cylindrical cavity located in a first one of said greater sides of said wave guide, having a cylindrical wall and having an axis perpendicular to said greater wave guide sides, said axis lying in a median plane of said wave guide;

a semiconductor diode located on said axis;

an elongate diode carrier for said diode centered on said axis of said cavity and to which one terminal of said diode is connected, said diode having a second terminal connected with said output connection of said impedance transforming low-pass filter, said filter output connection being seated in an orifice centered on said axis, provided in a second one of said greater wave guide sides;

means for setting said diode carrier in an adjustable position on said axis, said setting means including a rotary control for adjusting said position on said axis;

means for preventing said diode carrier from rotating about said axis during operation of said rotary position control;

an annular piston slidably mounted for axial displacement in said cavity between said diode carrier and the cylindrical wall of said cavity for tuning said cavity at a desired multiple of said incident signal frequency, said diode carrier having a cylindrical outer surface over a length of said carrier leading away from said diode for accommodating a sliding movement of said annular piston, said annular piston being provided with means for preventing rotation of said piston about said axis and means for adjusting the position of said piston in the axial direction, and having at its extremity nearer to said wave guide, inner and outer flexible crowns, said inner flexible crown providing for sliding contact with said diode carrier and said outer crown providing for sliding contact with said cavity wall, and a length-wise elastic connecting device for connecting said coaxial input central conductor connection to said filter input regardless of any axial adjustment of the position of said diode, which device is of a design that presents, at said filter input, a constant impedance having a magnitude of substantially 50 ohms and comprises first and second parts of both having an axis of rotational symmetry coinciding with said axis of said cylindrical cavity, said first part being shaped and disposed for telescoping on the exterior of said second part, an end portion of said first part being firmly connected to said central conductor connection of said coaxial input and a second end portion of said first part being firmly connected with the input end of said impedance transforming filter, a cylindrical conducting bellows being provided between said end portion of said first part for connecting said two end portions electrically together regardless of the spacing of said end portions from each other within a predetermined range, said second part being rigid and firmly connected to said central conductor connection of said coaxial input and having cylindrical portions respectively for axially guiding said bellows and for guiding said second end portion of said first part for maintaining the end portions of said first part in alignment, said elastic connecting device further comprising a helical spring located in an interior hollow region of said second end portion of said first part and having an axis coincident with said axis of symmetry of said first part, in a manner butting on an interal shoulder of said first part and exerting a force tending to spread apart said first and second portions of said first part and thereby to displace said impedance transforming filter along said axis for maintaining said output of said filter in contact with said second terminal of said diode regardless of the axial position of said diode holder.

* * * * *